United States Patent [19]

Lee

[11] Patent Number: 4,825,410
[45] Date of Patent: Apr. 25, 1989

[54] SENSE AMPLIFIER CONTROL CIRCUIT

[75] Inventor: Hsing-San Lee, Essex Junction, Vt.

[73] Assignee: International Business Machines Corporation, Armonk, N.Y.

[21] Appl. No.: 112,348

[22] Filed: Oct. 26, 1987

[51] Int. Cl.$^4$ .............................. G11C 13/00
[52] U.S. Cl. ................... 365/189; 365/230; 365/241
[58] Field of Search ........... 365/189, 191, 203, 206, 365/230, 241

[56] References Cited

U.S. PATENT DOCUMENTS 4,429,375  1/1984  Kobayashi et al. ............ 365/240
4,649,522  3/1987  Kirsch .......................... 365/189
4,663,735  5/1987  Novak et al. ................. 364/900

Primary Examiner—Terrell W. Fears
Attorney, Agent, or Firm—Stephen J. Limanek

[57] ABSTRACT

An improved memory sensing control circuit is provided wherein pulses derived from row or word address changes and from column or bit address changes are used to produce set pulses which are applied at optimum time intervals to a sense amplifier. More particularly, the memory sensing control circuit includes first and second paths for transmitting a bit decoder drive pulse coupled to a sense amplifier set device and means responsive to pulses derived from row or word and column or bit address change detecting means for selecting one of the first and second paths.

28 Claims, 3 Drawing Sheets

SENSE AMPLIFIER CONTROL CIRCUIT

Description

1. Technical Field

This invention relates to integrated semiconductor circuits and more particularly to sense amplifying circuits used in memory systems.

2. Background Art

Memory systems, particularly, high performance static random access memory systems, are required which have little or no unnecessary timing delays.

In U.S. Pat. No. 4,649,522, filed on Feb. 11, 1985, by H. C. Kirsch, there is disclosed a dynamic random access memory which obtains improved access time for reading data from a multiplicity of memory cells along a given selected row by allowing the data output line to remain active between activations of a column enable signal.

U.S. Pat. No. 4,663,735, filed Dec. 30, 1983, by M. F. Novak et al, discloses a random/serial access mode selection circuit wherein a serial mode is assumed in response to both a row address signal and a suitable data output control signal and a random or parallel mode is assumed when only the row address is received.

U.S. Pat. No. 4,429,375, filed July 23, 1981, by S. Kobayashi et al, discloses a memory addressing technique wherein a consecutive accessing mode is entered when accessing consecutive memory cells on the same word line.

DISCLOSURE OF THE INVENTION

It is an object of this invention to provide an improved high performance memory sensing control circuit which automatically adjusts the timing of the set pulse of a sense amplifier for optimum operation, particularly when in a static column or fast page mode.

In accordance with the teachings of this invention, an improved memory sensing control circuit is provided wherein pulses derived from row or word address changes and from column or bit address changes are used to produce set pulses which are applied at optimum time intervals to a sense amplifier. More particularly, the memory sensing control circuit includes first and second paths for transmitting a bit decoder drive pulse coupled to a sense amplifier set device and means responsive to pulses derived from row or word and column or bit address change detecting means for selecting one of the first and second paths.

The foregoing and other objects, features and advantages of the invention will be apparent from the following more particular description of the preferred embodiments of the invention, as illustrated in the accompanying drawings.

BEST MODE FOR CARRYING OUT THE INVENTION

Figure 1A:
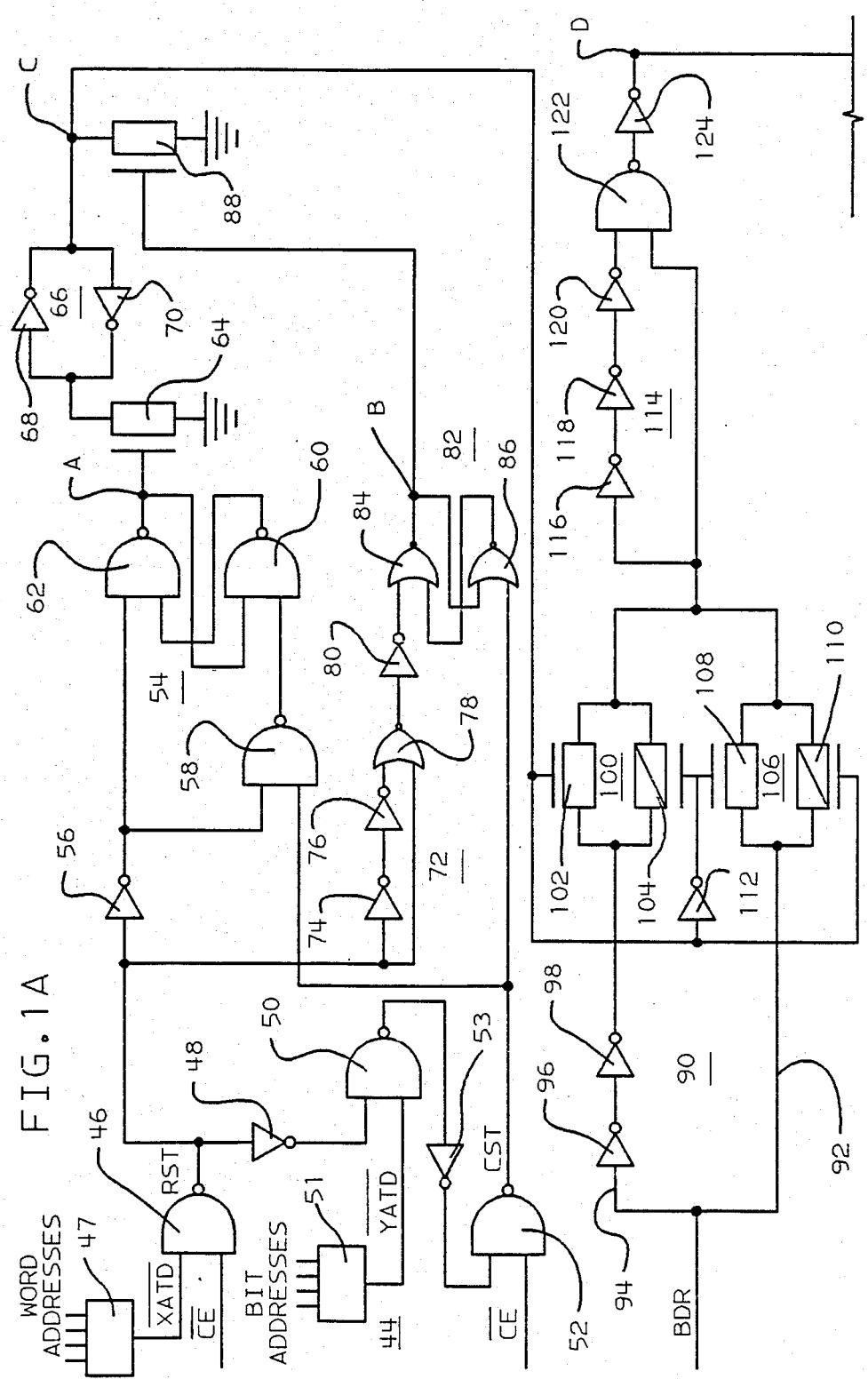
FIGS. 1A and 1B, combined, illustrate a circuit diagram of the sense amplifier control circuit of the present invention, and FIG. 2 indicates voltages plotted against times which occur at various points in the circuit of FIGS. 1A and 1B during the read operation thereof.
Figure 1B:
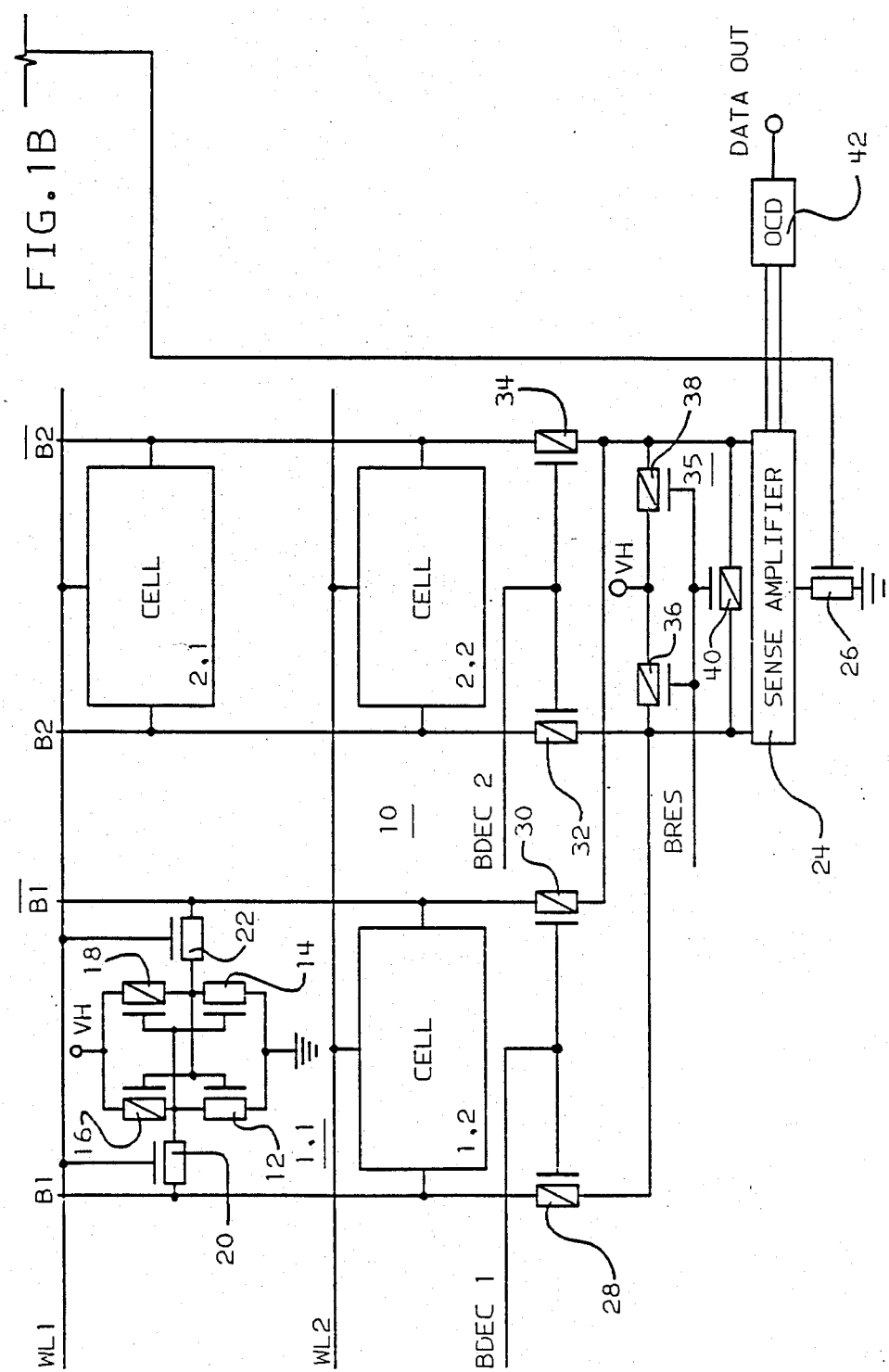

Referring to FIGS. 1A and 1B of the drawings in more detail, there is illustrated an embodiment of the sense amplifier control circuit of the present invention along with a memory array 10 having known static memory cells 1,1; 1,2; 2,1; and 2,2, with cell 1,1 being illustrated in some detail in FIG. 1B. The cell 1,1 includes cross-coupled N-channel field effect transistors 12 and 14 and a pair of load transistors 16 and 18 connected to a voltage supply terminal VH, which may be at 3.3 volts. The load transistors 16 and 18 are P-channel field effect transistors, the P-channel field effect transistors being indicated in FIGS. 1A and 1B by a rectangle with a diagonal line passing therethrough. First and second access transistors 20 and 22, respectively, are connected between the cross-coupled transistors 12, 14, and a pair of bit/sense lines B1 and $\overline{B1}$. A first word line WL1 is connected to the control electrodes of the access transistors 20 and 22. The cell 1,2 is also connected between the bit line pair B1 and $\overline{B1}$. A second pair of bit lines B2 and $\overline{B2}$ have the cells 2,1 and 2,2 connected therebetween. The pairs of bit lines B1, $\overline{B1}$ and B2, $\overline{B2}$ are connected in parallel to a sense amplifier 24 having a pull-down device 26 attached thereto. First bit switch or isolation means include P-channel transistors 28 and 30 disposed within the pair of bit lines B1 and $\overline{B1}$ between the sense amplifier 24 and the cells 1,1 and 1,2. Second bit switch or isolation means include P-channel transistors 32 and 34 disposed within the pair of bit lines B2 and $\overline{B2}$ between the sense amplifier 24 and the cells 2,1 and 2,2. A bit restore circuit 35 is connected between the inputs of the sense amplifier 24. The bit restore circuit 35 includes a pair of serially arranged P-channel transistors 36 and 38 with the voltage supply terminal VH connected to the common point between the P-channel transistors 36 and 38, as well as a P-channel bit line voltage equalizing transistor 40. A bit line restore pulse is applied to the control electrodes of the P-channel transistors 36, 38 and 40 through a bit line restore line BRES. A first bit line decode pulse is applied to the control electrodes of the first bit switch transistors 28, 30 through a bit decode line BDEC 1 and a second bit line decode pulse is applied to the control electrodes of the second bit switch transistors 32, 34 through a bit decode line BDEC 2. The first word line WL1, in addition to being connected to the access transistors 20 and 22 of the cell 1,1, is also connected to access transistors of the cell 2,1, indicated only in block form. A second word line WL2 is connected to the access transistors of the cell 1,2 and to the access transistors of the cell 2,2, both indicated only in block form. Cells 1,2; 2,1; and 2,2 are similar to cell 1,1. An off-chip driver, OCD 42, has an input connected to the output of the sense amplifier 24 and an output connected to a DATA OUT terminal.

The sense amplifier control circuit includes strobe pulse generating means 44, as indicated in FIG. 1A, which includes a first NAND circuit 46 having a first input to which a chip enable pulse $\overline{CE}$ is applied and a second input to which a word address transition detector output pulse $\overline{XATD}$ is applied, which is received from a word address transition detector 47, of any known type, having memory array 10 word addresses applied thereto. At the output of the first NAND circuit 46, there is produced a row strobe pulse RST which is applied to an input of a first inverter circuit 48 having an output connected to a second NAND circuit 50, with a second input of the second NAND circuit 50 having applied thereto a bit address transition detection output pulse $\overline{YATD}$, which is received from a bit address transition detector 51 having memory array 10 bit addresses applied thereto. The output of the second NAND circuit 50, after passing through a second inverter circuit 53, is applied to a first input of a third NAND circuit 52 having a second input to which is applied the chip enable pulse $\overline{CE}$, producing a column strobe pulse CST at the output of third NAND circuit 52.

The row strobe pulse RST from the output of the first NAND circuit 46 and the column strobe pulse CST from the output of the third NAND circuit 52 are applied to a regular read cycle detection circuit 54 which includes a third inverter 56 having an input connected to the output of the first NAND circuit 46 and an output connected to a first input of a fourth NAND circuit 58, with a second input of the NAND circuit 58 being connected to the output of the third NAND circuit 52 of the strobe pulse generating means 44. The output of the fourth NAND circuit 58 is connected to a first input of a fifth NAND circuit 60 having an output connected to a first input of a sixth NAND circuit 62. A second input of the sixth NAND circuit 62 is connected to the output of the third inverter circuit 56, with the output of NAND circuit 62 being connected to a second input of the fifth NAND circuit 60. The output of the sixth NAND circuit 62 is also connected at node A to the control electrode of a first N-channel pull-down transistor 64 having a drain connected to a latch 66. The latch 66 includes a fourth inverter circuit 68 and a fifth inverter circuit 70. The regular read cycle detection circuit 54 may be referred to, as is known, as a set predominant flip-flop.

The output of the first NAND circuit 46 of the strobe pulse generating means 44 is also connected to a falling edge delay circuit 72 which includes a sixth inverter 74 having an input connected to the output of the first NAND circuit 46 and an output connected to an input of a seventh inverter circuit 76. The output of the seventh inverter circuit 76 is connected to a first input of a first NOR circuit 78 with a second input of the NOR circuit 78 being connected directly to the output of the first NAND circuit 46. The output of the first NOR circuit 78 is connected to an eighth inverter circuit 80. A static column, toggle or fast access mode detecting circuit 82 includes a second NOR circuit 84 and a third NOR circuit 86. A first input of the second NOR circuit 84 is connected to the output of the falling edge delay circuit 72, i.e., to the output of the eighth inverter circuit 80, and a second input of the second NOR circuit 84 is connected to the output of the third NOR circuit 86. A first input of the third NOR circuit 86 is connected to the output of the third NAND circuit 52 of the strobe pulse generating means 44 and a second input of the third NOR circuit 86 is connected to the output of the second NOR circuit 84. The output of the second NOR circuit 84 is also connected at node B to the control electrode of a second N-channel pull-down transistor 88 coupled to the latch 66. The static column, toggle or fast access mode detecting circuit 82 may generally be referred to, as is known, as a NOR or R-S flip/flop or set/reset latch.

A multiplexer 90 having first and second paths 92 and 94, respectively, has applied to its input a bit decoder drive pulse at line BDR. The second path 94 includes a ninth inverter circuit 96 having an input to which the bit decoder drive pulse on line BDR is applied and an output connected to a tenth inverter circuit 98 and a first CMOS pass circuit or switch 100 having a first N-channel transistor 102 and a first P-channel transistor 104 connected in parallel with transistor 102. The first path 92 of the multiplexer 90 includes only a second CMOS pass circuit or switch 106 having a second N-channel transistor 108 and a second P-channel transistor 110 connected in parallel with the second N-channel transistor 108. The switch 106 is connected across the inverter circuits 96 and 98 and the switch 100. The drain of the second pull-down transistor 88 is connected at node C to the control electrode of the first transistor 102 of the switch 100 and to the control electrode of the second P-channel transistor 110 of the second switch 106, with the first P-channel transistor 104 of the first switch 100 and the second N-channel transistor 108 of the second switch 106 being connected to the drain of the second pull-down transistor 88 through an eleventh inverter circuit 112. A sense amplifier set circuit 114 has an input connected to the output of the multiplexer 90 and an output connected at node D to the control electrode of the sense amplifier set transistor 26. The sense amplifier set circuit 114 includes a twelfth inverter circuit 116, a thirteenth inverter circuit 118 and a fourteenth inverter circuit 120, all serially arranged. The output of the inverter circuit 120 is connected to a first input of a seventh NAND circuit 122 with a second input of the NAND circuit 122 being directly connected to the output of the multiplexer 90. The output of the seventh NAND circuit 122 is connected to an input of a fifteenth inverter circuit 124 having an output connected at node D to the control electrode of the sense amplifier set transistor 26.

The operation of the sense amplifier control circuit of the present invention, as illustrated in FIGS. 1A and 1B of the drawings, will now be described.

The memory array 10 shown in FIG. 1B operates generally in a known manner. To select, for example, the cell 1,1 after a chip enable pulse $\overline{CE}$ is applied, the bit restore circuit 35, having applied thereto a pulse on line BRES, is turned on and then bit switch means 28, 30 is turned on to apply equal voltages to each of the bit lines of the pair of bit lines B1, $\overline{B1}$. Also, a word pulse is applied to word line WL1 which turns on the access transistors 20 and 22. Prior to turning on the access transistors 20 and 22, the bit restore circuit 35 is turned off so as to float the bit lines B1 and $\overline{B1}$ at a voltage equal to or about VH minus a threshold voltage $V_t$. With the bit lines B1 and $\overline{B1}$ floating and the access transistors 20 and 22 turned on, one of the bit lines B1 or $\overline{B1}$ will discharge, depending upon which one of the cross-coupled transistors 12 and 14 is turned on. After one of the bit lines B1 or $\overline{B1}$ begins to discharge, and with the bit switch means 28, 30 on, the sense amplifier set transistor 26 is turned on to fully set the sense amplifier 24. The output from the sense amplifier 24 is connected to the input of the off chip driver 42 with binary information or data being provided at the DATA OUT terminal. To select another cell of the memory array 10, for example, cell 2,2, the bit restore circuit 35 is again turned on and then the bit switch means 32,34 is turned on by a pulse on the bit decode line BDEC 2. To float the pair of bit lines B2 and $\overline{B2}$, the bit restore circuit 35 is again turned off. A pulse on word line WL2 is then applied to the access transistors of the cell 2,2 which will discharge one of the bit lines of the pair of bit lines B2 and $\overline{B2}$. As one of the bit lines B2 or $\overline{B2}$ is being discharged, and with the bit switch means 32,34 on, the sense amplifier set transistor 26 is again turned on to fully set the sense amplifier 24. The output from the sense amplifier 24 is then again passed through the off chip driver 42 to the DATA OUT terminal. The other cells of the array, such as cell 1,2 and cell 2,1, are accessed in a similar manner.

Figure 2:
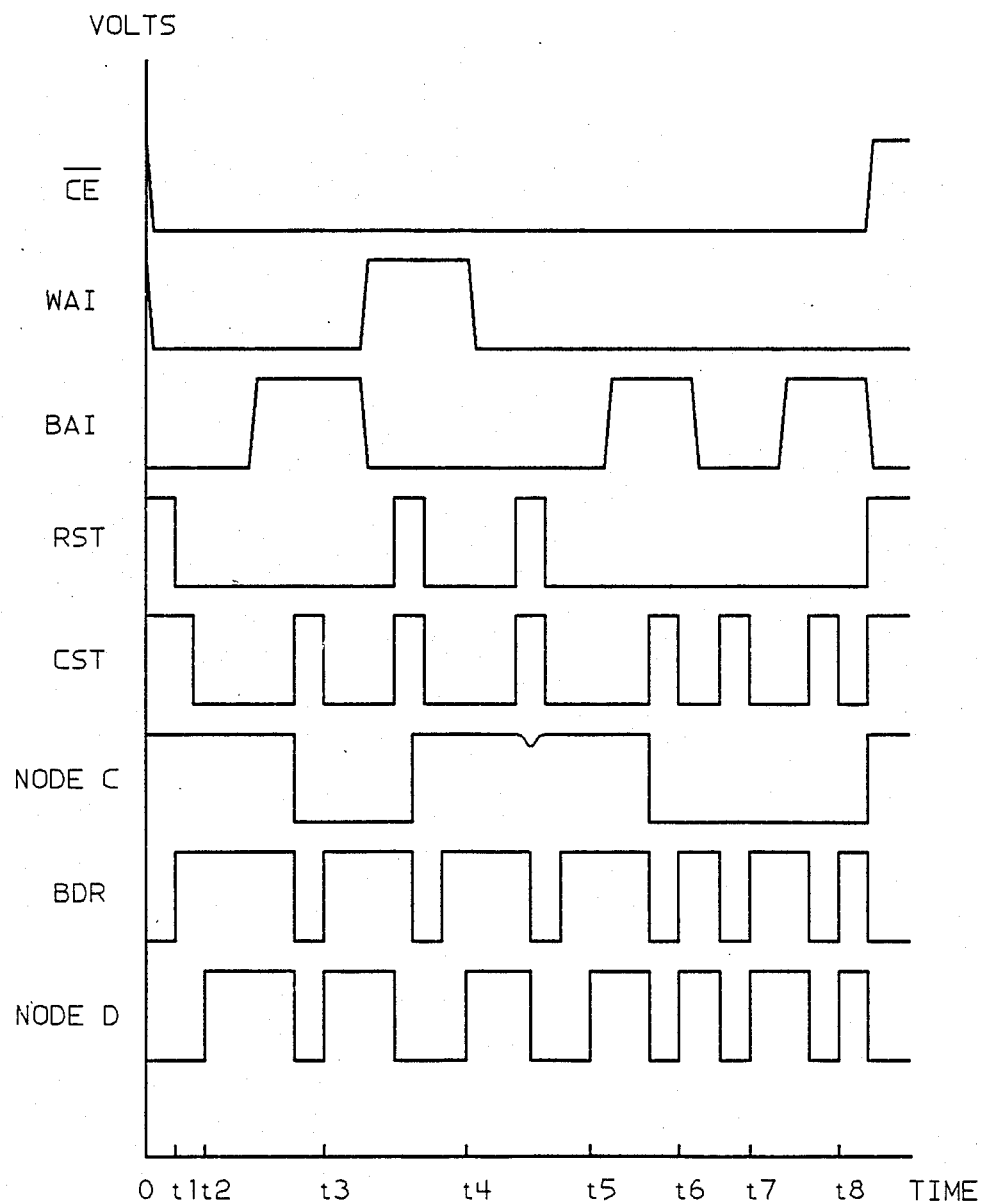

The operation of the sense amplifier control circuit of the present invention, particularly the portion thereof illustrated in FIG. 1A of the drawings, will best be understood by referring to the pulses illustrated in FIG. 2 of the drawings in conjunction with the circuit diagram of FIGS. 1A and 1B. With the chip enable not pulse $\overline{CE}$ and the word address transition pulse $\overline{XATD}$ derived from the word address transition detection circuit 47 applied to the first NAND circuit 46, the row strobe pulse RST is generated at the output of the first NAND circuit 46. The row strobe pulse RST is applied to the second NAND circuit 50 through the first inverter circuit 48 along with a pulse $\overline{YATD}$ derived from the bit address transition detector circuit 51. The output of the second NAND circuit 50 is applied to the third NAND circuit 52 through the second inverter 53 along with the chip enable not pulse $\overline{CE}$ to produce the column strobe pulse CST. The row strobe pulse RST and the column strobe pulse CST are applied to the regular read cycle detection circuit 54 to produce at node A a high voltage which turns on the first pull-down transistor 64. With transistor 64 turned on, the voltage at node C is high which turns on the N-channel transistor 102 of the first pass circuit 100 and also turns on the P-channel transistor 104 of the first pass circuit 100 after passing through the eleventh inverter 112. At the time that the column strobe pulse CST is generated, a bit decoder drive pulse is applied to bit decode drive line BDR and to the multiplexer 90. Since the first pass circuit 100 is turned on, while the second pass circuit 106 is turned off, the pulse from the line BDR passes through the second path 94 of the multiplexer 90 including the ninth and tenth inverter circuits 96 and 98, respectively, through the closed first pass circuit or switch 100 to the input of the sense amplifier set circuit 114. The output pulse at the output of circuit 114, i.e., at node D, is a high sense amplifier trigger control pulse which is applied to the gate electrode of the sense amplifier set transistor 26. It should be noted that when the row strobe pulse RST and the column strobe pulse CST are applied to the static column toggle or fast access mode detecting circuit 82, the voltage at node B is low, and, therefore, the second pull-down transistor 88 remains in an off condition and node C remains high.

It should also be noted that at times a cell, such as cell 1,1, connected to the word line WL1 is selected, followed immediately by the selection of another cell such as cell 2,1 which is also connected to the word line WL1. In this instance, a transition pulse $\overline{XATD}$ from a word address transition detector is not produced and, therefore, the row strobe pulse RST at the output of the first NAND circuit 46 is not generated. However, in accordance with the operation of the memory array, the bit address is always generated and, therefore, a bit address transition pulse $\overline{YATD}$ from a bit address transition detection circuit is always produced. Accordingly, the column strobe pulse CST is generated at the output of the third NAND circuit 52 during each cycle of operation, as indicated in FIG. 2 of the drawings. With the row strobe pulse RST low and the column strobe pulse CST high, the regular read cycle detection circuit 54 will produce at node A a low voltage which will not turn on the first pull-down transistor 64. However, with the column strobe pulse CST high and the row strobe pulse RST low, the static column toggle or fast access mode detection circuit 82 will produce a high voltage at node B. The high voltage at node B turns on the second pull-down transistor 88 to discharge node C to ground. With node C at ground, the second P-channel transistor 110 and the second N-channel transistor 108 of the first pass circuit 106 will be turned on. With the first pass circuit 106 turned on, the bit decoder drive pulse on line BDR passes directly to the input of the sense amplifier set circuit 114 without delay. This pulse then produces, at node D, a sense amplifier trigger control pulse which turns on the sense amplifier set transistor 26 to set sense amplifier 24 at an earlier time in the cycle than it was turned on when a word address change was detected, as mentioned hereinabove.

Referring more specifically to the pulse program in FIG. 2 of the drawings, it can be seen that when the chip enable pulse $\overline{CE}$ turns on, i.e., in this instance goes low, the circuits of the selected chip are activated and both the word and bit address inputs WAI and BAI, respectively, are sent to the chip from a known memory circuit. The address transition circuits 47,51 for the word and bit addresses are activated and result in producing row strobe pulse RST and column strobe pulse CST, as indicated in FIG. 2. During the chip select time, either word or bit address input WAI or BAI changes will create corresponding one shot pulses RST or CST, or both, as is shown in FIG. 2 of the drawing.

It should be noted that the truth table for the regular read cycle detection circuit 54 is as follows:

| RST | CST | NODE A |
|-----|-----|--------|
| 0   | 0   | Q      |
| 0   | 1   | 0      |
| 1   | 0   | 1      |
| 1   | 1   | 1      | where Q is the voltage of the previous state.

It should also be noted that the truth table for the fast access mode detecting circuit 82 is as follows:

| RST | CST | NODE B |
|-----|-----|--------|
| 0   | 0   | Q      |
| 1   | 0   | 0      |
| 0   | 1   | 1      |
| 1   | 1   | 0      |

The delay circuit 72 is used to widen the RST pulse by delaying the falling edge of the RST pulse at chip select time. The high to low transition at the output of inverter 80 is delayed by the designed circuit delay of inverters 74 and 76 so as to ensure a desired margin of operation.

The sense amplifier set circuit 114 is provided to create a self-timed out one shot pulse for minimizing the power dissipation of the differential sense amplifier 26. The maximum pulse width of the output pulse at node D is limited by a designed delay time of inverters 116, 118, and 120.

It can be seen that in accordance with the teachings of this invention, a sense amplifier control circuit is provided for an asynchronous static random access memory having a mode detecting self-adjusting sense amplifier timer. More particularly, this invention provides optimized sense timing and access time during different modes of operation and, more specifically, during the fast static mode or toggle mode when a change in a word address is not required. In this invention, the differential sense amplifier set pulse is advanced to coincide with the bit switch pulse to immediately amplify any large signal being developed in the array bit lines. However, in the regular word access read cycle, the rising edge of the sense amplifier set pulse is automatically delayed to accommodate the word system delay, small and relatively slow array cell signal growth, sense amplifier parameter mismatches and noise. As can be seen in FIG. 2 of the drawings, the pulse wave form at node D shows the rising edge delay at times t2, t4, and t5 caused by the RST pulse. As can also be seen in FIG. 2 at times t3, t6, t7, and t8, no delay of the rising edge of the pulse wave form at node D with respect to the rising edge of the BDR pulse is produced, since RST strobe pulses have not been generated.

Although only two pairs of bit lines of the memory array are shown connected to the sense amplifier 24, it should be understood that many more bit line pairs, e.g., a total of 32 pairs, may be connected to one sense amplifier and that many other sense amplifiers may each have 32 other pairs of bit lines connected thereto. Also, the number of word lines may be increased to 256 or more, if desired.

While the invention has been particularly shown and described with reference to preferred embodiments thereof, it will be understood by those skilled in the art that various changes in form and details may be made therein without departing from the spirit and scope of the invention.

What is claimed is:

1. In a memory system having word and bit addresses, a sense amplifier control circuit comprising
a sense amplifier having a set device,
first means for producing a pulse for actuating said set device, said means including a first path arranged to pass the leading edge of said pulse to said set device at a given instant of time and a second path arranged to pass the leading edge of said pulse to said set device at an instant of time earlier than said given instant of time, and
second means responsive to pulses derived from word and bit address transitions for selecting one of said first and second paths.

2. In a memory system having word and bit addresses, a sense amplifier control circuit as set forth in claim 1 wherein said second means includes a latch coupled to said first and second paths and having first and second states, said latch being in said first state for selecting said first path and in said second state for selecting said second path.

3. In a memory system having word and bit addresses, a sense amplifier control circuit comprising
a sense amplifier having a set device,
first means for producing a pulse for actuating said set device, said means including a first path arranged to pass said pulse to said set device during a given period of time and a second path arranged to pass said pulse to said set device during a shorter period of time than said given period of time, and
second means responsive to pulses derived from word and bit address transitions for selecting one of said first and second paths, said second means including a latch having first and second states, said latch being in said first state for selecting said first path and in said second state for selecting said second path, said pulses derived from word and bit address transitions including a first strobe pulse derived from a word address transition and a second strobe pulse derived from a bit address transition and said second means further including a first circuit responsive to said first and second strobe pulses for setting said latch in a first state and a second circuit responsive to said first and second strobe pulses for setting said latch in said second state.

4. In a memory system having word and bit addresses, a sense amplifier control circuit as set forth in claim 3 wherein said first circuit is a set predominant flip-flop and said second circuit is a set/reset flip-flop.

5. In a memory system having word and bit addresses, a sense amplifier control circuit as set forth in claim 4 wherein said first means further includes first and second pull-down transistors connected to opposite ends of said latch and the output of said first circuit is connected to the control electrode of said first pull-down transistor and the output of said second circuit is connected to the control electrode of said second pull-down transistor.

6. In a memory system having word and bit addresses, a sense amplifier control circuit as set forth in claim 5 wherein said second pull-down transistor is connected to said first means.

7. In a memory system having word and bit addresses, a sense amplifier control circuit as set forth in claim 1 wherein said second means includes pulse generating means for generating a first strobe pulse from a word address transition and a second strobe pulse from said first strobe pulse and a bit address transition.

8. In a memory system having word and bit addresses, a sense amplifier control circuit comprising
a sense amplifier having a set device,
first means for producing a pulse for actuating said set device, said means including a first path arranged to pass said pulse to said set device during a given period of time and a second path arranged to pass said pulse to said set device during a shorter period of time than said given period of time, and
second means responsive to pulses derived from word and bit address transitions for selecting one of said first and second paths, said second means including pulse generating means for generating a first strobe pulse from a word address transition and a second strobe pulse from said first strobe pulse and a bit address transition, said second means further including a latch and a first circuit responsive to said first and second strobe pulses for setting said latch in a first state and a second circuit responsive to said second strobe pulse for setting said latch in a second state.

9. In a memory system having word and bit addresses, a sense amplifier control circuit as set forth in claim 8 wherein said second means further includes first and second pull-down transistors connected respectively to opposite ends of said latch, the output of the first circuit being connected to the control electrode of said first pull-down transistor and the output of the second circuit being connected to the control electrode of said second pull-down transistor.

10. In a memory system having word and bit addresses, a sense amplifier control circuit as set forth in claim 9 wherein said second pull-down transistor is connected to control elements of said first and second paths.

11. In a memory system having word and bit addresses, a sense amplifier control circuit as set forth in claim 8 wherein said first circuit includes a set-predominant flip-flop and said second circuit includes a set/reset flip-flop.

12. In a memory system having word and bit addresses, a sense amplifier control circuit as set forth in claim 11 wherein said set-predominant flip-flop includes
an inverter circuit having the first strobe pulse applied to an input thereof,
a first NAND circuit having the second strobe pulse applied to an input thereof, a second input thereof being connected to the output of said inverter circuit,
a second NAND circuit having a first input connected to the output of said first NAND circuit, and
a third NAND circuit having a first input connected to the output of said second NAND circuit and a second input connected to the output of said inverter circuit, the output of said third NAND circuit being coupled to a first end of said latch.

13. In a memory system having word and bit addresses, a sense amplifier control circuit as set forth in claim 11 wherein said set/reset flip-flop includes
first and second NOR circuits, the output of said first NOR circuit being connected to a first input of said second NOR circuit and the output of said second NOR circuit being connected to a first input of said first NOR circuit, a second input of said first NOR circuit having the first strobe pulse applied thereto and a second input of said second NOR circuit having the second strobe pulse applied thereto, the output of said first NOR circuit also being coupled to a second end of said latch.

14. In a memory system having word and bit addresses, a sense amplifier control circuit as set forth in claim 12 wherein said second means further includes a pull-down transistor connected to the first end of said latch and the output of said set predominant flip-flop is connected to the control electrode of said pull-down transistor.

15. In a memory system having word and bit addresses, a sense amplifier control circuit as set forth in claim 13 wherein said second means further includes a pull-down transistor connected to the second end of said latch and the output of said set predominant flip-flop is connected to the control electrode of said pull-down transistor.

16. In a memory system having word and bit addresses, a sense amplifier control circuit as set forth in claim 15 wherein said second means further includes a delay circuit disposed between said pulse generating means and the second input of said first NOR circuit.

17. In a memory system having word and bit addresses, a sense amplifier control circuit as set forth in claim 16 wherein said delay circuit includes
an input terminal
a third NOR circuit having a first input connected to said input terminal,
first inverting means disposed between said input terminal and a second input of said third NOR circuit, and
second inverting means having an input connected to the output of said third NOR circuit and an output connected to the second input of said first NOR circuit.

18. In a memory system having word and bit addresses, a sense amplifier control circuit as set forth in claim 1 wherein said first path includes a first switch and a delay element serially interconnected and said second path includes a second switch arranged in parallel with said first path.

19. In a memory system having word and bit addresses, a sense amplifier control circuit as set forth in claim 18 wherein each of said first and second switches includes an N-channel field effect transistor and a P-channel field effect transistor connected in parallel with said N-channel transistor.

20. In a memory system having word and bit addresses, a sense amplifier control circuit comprising
a sense amplifier having a set device,
first means for producing a pulse for actuating said set device, said means including a first path arranged to pass said pulse to said set device during a given period of time and a second path arranged to pass said pulse to said set device during a shorter period of time than said given period of time,
second means responsive to pulses derived from word and bit address transitions for selecting one of said first and second paths, said first path including a first switch and a delay element serially interconnected and said second path including a second switch arranged in parallel with said first path, each of said first and second switches including an N-channel field effect transistor and a P-channel field effect transistor connected in parallel with said N-channel transistor, and
an inverter circuit disposed between the output of said second means and the control electrode of the P-channel transistor of said first switch the control electrode of the N-channel transistor of said second switch.

21. In a memory system having word and bit addresses, a sense amplifier control circuit comprising
a sense amplifier having a set device,
first means for producing a pulse for actuating said set device, said means including a first path arranged to pass said pulse to said set device during a given period of time and a second path arranged to pass said pulse to said set device during a shorter period of time than said given period of time, and
second means responsive to pulses derived from word and bit address transitions for selecting one of said first and second paths, said first path including a first switch and a delay element serially interconnected and said second path including a second switch arranged in parallel with said first path, said first means further including a sense amplifier set circuit having an input terminal connected to said first and second paths and an output terminal connected to a control electrode of said set device.

22. In a memory system having word and bit addresses, a sense amplifier control circuit as set forth in claim 21 wherein said sense amplifier set circuit includes
a NAND circuit having a first input connected to said input terminal,
a delay element disposed between the input terminal and a second input of said NAND circuit, and
an inverter circuit having an input connected to the output of said NAND circuit and an output connected to the control electrode of said set device.

23. In a memory system having word and bit addresses, a sense amplifier control circuit as set forth in claim 22 wherein said delay element includes a second inverter circuit.

24. A sense amplifier control circuit comprising
a word address transition detecting circuit,
a bit address transition detecting circuit, pulse generating means for deriving a first strobe pulse at a first terminal from said word address transition detecting circuit and a second strobe pulse at a second terminal from said bit address transition detecting circuit, a sense amplifier having a set transistor, first means for generating a control pulse for actuating said set transistor, said first means including a multiplexer having a first path with a given time delay and a second path with a time delay significantly shorter than that of said first path, an input pulse being applied to the input of said multiplexer substantially simultaneously with the generation of said second strobe pulse, and second means responsive to said first and second strobe pulse for selectively opening and closing said first and second paths of said first means.

25. A sense amplifier control circuit as set forth in claim 24 wherein said second means includes first circuit means responsive to said first and second strobe pulses for closing said first path and opening said second path and second circuit means responsive to said first and second strobe pulses for closing said second path and opening said first path.

26. A sense amplifier control circuit as set forth in claim 25 wherein said second means further includes a latch and first and second pull-down transistors connected respectively to opposite ends of said latch, the output of said first circuit being connected to the control electrode of said first pull-down transistor and the output of said second circuit being connected to the control electrode of said second pull-down transistor.

27. A static memory system comprising an array of memory cells having first, second, third and fourth cells, a first word line having a first word address connected to said first and second cells of said array of cells, a second word line having a second word address connected to said third and fourth cells of said array of cells, first and second bit lines, said first bit line being connected to said first and third cells and said second bit line being connected to said second and fourth cells, a sense amplifier having a set transistor connectable to said first, second, third, and fourth cells, word address transition detecting means for detecting a change from the first word address to the second word address, pulse generating means coupled to said word address transition detecting means for generating a first strobe pulse and for subsequently generating a second strobe pulse, a latch circuit having first and second states, first circuit means responsive to said first and second strobe pulses for setting said latch circuit in said first state, second circuit means responsive to said second strobe pulse for setting said latch circuit in said second state, means for generating a control pulse for actuating said set transistor, said control pulse generating means including a multiplexer having a first circuit path with a given pulse time delay and a second circuit path with a pulse time delay significantly shorter than that of said first path, and means for generating an input pulse to the input of said multiplexer substantially simultaneously with the generation of said second strobe pulse, said first circuit path including first switching means controlled by the first state of said latch circuit and said second circuit path including second switching means controlled by the second state of said latch circuit.

28. A static memory system as set forth in claim 27 further including first and second pull-down transistors connected respectively to opposite ends of said latch circuit, the output of said first circuit means being connected to the control electrode of said first pull-down transistor and the output of said second circuit means being connected to the control electrode of said second pull-down transistor.

* * * * *